(12) United States Patent
Kratzer et al.

(10) Patent No.: US 11,310,912 B2
(45) Date of Patent: Apr. 19, 2022

(54) HIGH-CURRENT CIRCUIT

(71) Applicant: Auto-Kabel Management GmbH, Hausen i.W. (DE)

(72) Inventors: Udo Kratzer, Aachen (DE); David Cacciatore, Kempen (DE)

(73) Assignee: Auto-Kabel Management GmbH, Hausen (DE)

( * ) Notice: Subject to any disclaimer, the term of this patent is extended or adjusted under 35 U.S.C. 154(b) by 0 days.

(21) Appl. No.: 17/289,553

(22) PCT Filed: Oct. 1, 2019

(86) PCT No.: PCT/EP2019/076506
§ 371 (c)(1),
(2) Date: Apr. 28, 2021

(87) PCT Pub. No.: WO2020/088868
PCT Pub. Date: May 7, 2020

(65) Prior Publication Data
US 2021/0360788 A1    Nov. 18, 2021

(30) Foreign Application Priority Data
Oct. 30, 2018 (DE) ..................... 10 2018 127 075.5

(51) Int. Cl.
*H05K 1/02* (2006.01)
*H05K 1/11* (2006.01)

(52) U.S. Cl.
CPC ........... *H05K 1/113* (2013.01); *H05K 1/0212* (2013.01); *H05K 1/0265* (2013.01); *H05K 2201/10053* (2013.01)

(58) Field of Classification Search
CPC .... H05K 1/113; H05K 1/0212; H05K 1/0265; H05K 2201/10053
See application file for complete search history.

(56) References Cited

U.S. PATENT DOCUMENTS 5,661,902 A * 9/1997 Katchmar ........... H01L 23/3672
174/252
5,923,084 A * 7/1999 Inoue .................. H01L 23/3121
257/712

(Continued)

FOREIGN PATENT DOCUMENTS

DE    10 2005 014 413 A1    9/2006
DE    10 2013 204 889 A1    9/2014

(Continued)

OTHER PUBLICATIONS

International Searching Authority/EP, International Search Report and Written Opinion of the International Searching Authority, Application No. PCT/EP2019/076506, dated Dec. 16, 2019, (in German, with English translation of the International Search Report, 15 pages.

(Continued)

*Primary Examiner* — Hoa C Nguyen
(74) *Attorney, Agent, or Firm* — Sunstein LLP (57) ABSTRACT

High-current circuit having a printed circuit board comprising a non-conductive substrate 2, a conductor layer 4 applied to the substrate 2 and an insulation layer 6 applied to the conductor layer, contact pads 8, 10, 12, 20, 22, 24 in each case interrupting the insulation layer 6 being arranged on both sides of the conductor plate, and the contact pads 8, 10, 12, 20, 22, 24 making contact with one another via vias 14 through the substrate 2, and the vias 14 being arranged in the area of the contact pads 8, 10, 12, 20, 22, 24, 10, 12, 20, 22, 24, characterized in that at least a first one of the contact pads 8 is arranged on a first side of the printed circuit board and a first semiconductor switch 28 is connected directly to at least a second one of the contact pads 20 on a second side of the printed circuit board, and in that the semiconductor switch 28 is connected to the first contact pad 8 directly via (Continued)

the vias 14 and the second contact pad 20, without further conductor tracks.

19 Claims, 7 Drawing Sheets

(56) References Cited

U.S. PATENT DOCUMENTS

| | | | | |
|---|---|---|---|---|
| 7,872,869 | B2* | 1/2011 | Lee | H05K 1/0206 |
| | | | | 361/719 |
| 9,101,082 | B1* | 8/2015 | Dorenkamp | H05K 5/03 |
| 2002/0162678 | A1 | 11/2002 | Takano | |
| 2003/0029637 | A1* | 2/2003 | Barcley | H05K 1/0206 |
| | | | | 174/262 |
| 2004/0112884 | A1 | 6/2004 | Uhl et al. | |
| 2009/0067130 | A1 | 3/2009 | Hahn et al. | |
| 2009/0321917 | A1 | 12/2009 | Stoehr et al. | |
| 2010/0051972 | A1* | 3/2010 | Chen | H01L 25/0753 |
| | | | | 257/88 |
| 2017/0290169 | A1 | 10/2017 | Adler et al. | |
| 2019/0198423 | A1* | 6/2019 | Lam | H01L 21/4846 |
| 2020/0288562 | A1* | 9/2020 | Okagawa | H05K 1/115 |
| 2021/0114751 | A1* | 4/2021 | Miyamoto | H01L 23/3677 |

FOREIGN PATENT DOCUMENTS

| | | |
|---|---|---|
| DE | 10 2016 107 249 A1 | 10/2017 |
| WO | WO 02/057100 A2 | 7/2002 |
| WO | WO 2009/068867 A1 | 6/2009 |
| WO | WO 2011/153277 A2 | 12/2011 |

OTHER PUBLICATIONS

German Patent Office, Office Action, Application No. 10 2018 127 075.5, dated Jul. 4, 2019, 11 pages, (in German).

* cited by examiner

HIGH-CURRENT CIRCUIT

CROSS-REFERENCE TO RELATED APPLICATIONS

This application is the national phase entry of international patent application no. PCT/EP2019/076506 filed Oct. 1, 2019 and claims the benefit of German patent application No. 10 2018 127 075.5, filed Oct. 30, 2018, the disclosures of which are incorporated herein by reference in their entirety.

TECHNICAL FIELD

The subject matter relates to a high-current circuit, in particular a motor vehicle high-current circuit, in particular a high-current switch, a controlled high-current resistor and an automatic start-stop circuit.

BACKGROUND ART

The constant increase in the number of electrical components in modern vehicles causes an increasing energy demand and associated high amperages. Very high switching currents occur, which are switched with semiconductor switches, for example MOSFETs or IGBTs. Due to the high currents that are switched with these semiconductor switches, two challenges arise. On the one hand, the current-carrying capacity must be guaranteed by the circuit, which means that currents of up to several 100 A must be able to flow through the circuit. This high current-carrying capacity requires large conductor cross-sections, which usually cannot be realised on printed circuit boards. Complex high-current printed circuit boards with an electrically conductive substrate are known, but these are very expensive to manufacture and thus rather unsuitable for mass use. On the other hand, the high current flows result in considerable ohmic losses, whose Joule heat must be dissipated. The heat dissipation of conventional printed circuit boards is low, since their substrates are not conductive and thus also represent a poor thermal conductor.

For this reason, the subject matter was based on the object of providing a high-current circuit which, using conventional printed circuit boards, satisfies both the requirements for current-carrying capacity and the requirements for waste heat for applications with high currents, in particular in motor vehicles.

SUMMARY OF THE INVENTION

As mentioned at the beginning, the circuit is to be realised with a conventional printed circuit board. Such a printed circuit board is formed from a non-conductive substrate, a conductive layer applied to the substrate and an insulating layer applied to the conductive layer. The substrate may be a so-called prepreg. In particular, the substrate may be formed from a fibrous material and/or a synthetic resin. Substrates for printed circuit boards are well known. Any substrates known for printed circuit boards which are non-conductive can be used for the present application.

First, a conductive layer is applied to the substrate, which is, for example, a copper layer. In conventional printed circuit boards, this conductor layer is adapted by exposure and etching so that conductor tracks and contact pads are arranged on the printed circuit board. An insulation layer is applied to the conductor tracks etched in this way, whereby contact pads are excluded from the insulation. Also in the present printed circuit board, both conductor tracks and contact pads are provided.

In the present printed circuit board, contact pads that break through the insulation layer are arranged on both sides. These contact pads make contact with each other via conductive vias through the substrate of the printed circuit board. The vias are located directly in the area of the contact pads. The vias break through the substrate essentially vertically, so that the contact pads, which are connected to one another via vias, are arranged directly above one another in a normal projection onto the substrate.

To ensure a high current-carrying capacity while at the same time providing good thermal conduction, it is proposed that at least a first one of the contact pads is arranged on a first side of the printed circuit board and a first semiconductor switch is directly connected to at least a second one of the contact pads on a second side of the printed circuit board. The semiconductor switch is thus located directly on the second contact pad and an electrical connection between the first contact pad and the second contact pad is made via the vias arranged between the first and the second contact pad. This makes it possible to connect the semiconductor switch to the first contact pad via the second contact pad and the vias without the need for further conductor tracks. This means that the contact pads arranged on opposite sides of the PCB are directly connected via the vias and a current from a semiconductor switch can reach the first contact pad directly via the second contact pad and the vias without being routed via thin conductor tracks applied to the substrate.

This directness of the connection between the first side of the PCB and the second side of the PCB has the particular advantage that a very high current-carrying capacity is ensured, since the current does not have to be conducted via thin conductor layers, but can flow directly through the vias. In addition, the contacting of two contact pads via vias is a particularly simple method for the production of printed circuit boards that is suitable for mass production, so that the printed circuit boards can also be reliably produced in large quantities.

Furthermore, it is possible to apply a heat sink or a flat part directly on the contact pad and/or directly on the semiconductor switch.

According to an embodiment, it is proposed that the areas of the first and second contact pads are arranged one above the other on the two sides of the printed circuit board. Thus, in a normal projection onto the PCB, the two contact pads arranged on opposite sides of the PCB overlap each other. In particular, the size of the contact pads is substantially identical. The contact pads are larger than conventional contact pads in that they occupy areas that are a multiple, in particular by a factor of more than 10, preferably more than 50, larger than the areas of contact pins of the semiconductor switches, so that the contact pads have a high current-carrying capacity.

According to one embodiment, it is proposed that a flat part is directly connected to the first of the contact pads on the first side of the printed circuit board. The flat part can rest directly on the first contact pad and, in particular, be connected to the contact pad over its entire area. The contact pad on the first side of the printed circuit board can occupy an area that extends over the area of connection pins of a plurality of semiconductor switches. Thus, it is possible that on the second side of the PCB two or more semiconductor switches are electrically connected in parallel to each other via second contact pads to the first contact pad and the first and/or second contact pad is full-surface and has a single electrical potential.

It is also possible that the contact pad is metallically coated over its entire area, in particular with a tin layer. Thus, on the one hand, a current flow and, on the other hand, a heat transfer are possible over the entire contact pad. If the flat part is directly connected to the first contact pad and the first contact pad has a large surface area, very good heat transfer from the contact pad to the flat part is possible. The flat part can be applied directly to the first contact pad, in particular soldered. The flat part can be placed on the contact pad and connected to the contact pad by means of reflow soldering, for example. The contact pad lying in the area of the surface of the flat part can be full-surface, without interruption, so that heat transfer from the contact pad to the flat part is possibly high.

According to an embodiment, it is proposed that on the second side of the printed circuit board at least one contact pin of the semiconductor switch is directly connected to the first of the contact pads. A semiconductor switch may also be connected with all contact pins of a power terminal to the first contact pad. In this case, all contact pins can be at the same electrical potential and the contact pad can be the only surface connected to these contact pins. This also enables large-area heat dissipation and contacting with the contact pins of the semiconductor switch. The semiconductor switches may have two power terminals as well as one switching terminal. Power terminals are, for example, source and drain, and a switching terminal may be gate.

As explained above, one or more semiconductor switches may have a first power terminal directly connected to the first contact pad. On the second side of the PCB, there may further be a third contact pad which is connected to second contact pins of the semiconductor switch. It is possible that two semiconductor switches are connected in series with each other on the second side of the circuit board and that the series-connected semiconductor switches are directly connected via a third contact pad. The semiconductor switches can rest on the second side of the printed circuit board and on the one hand be arranged with contact pins of a power terminal on first contact pads and be connected with the corresponding contact pins of a power terminal on a third contact pad. The third contact pad creates an electrical short circuit between the two semiconductor switches or the contact pins of a power terminal. The entire current to be switched flows via this third contact pad.

Corresponding to the third contact pad, a fourth contact pad can be provided on the first side of the PCB. This contact pad may be insulated from the first contact pads. The fourth contact pad can be contacted with the third contact pad via vias. Thus, on the one hand, a current can flow via the fourth contact pad and, on the other hand, the fourth contact pad can be used for heat transfer.

The structure of the high-current circuit can, for example, be such that the semiconductor switches are arranged on the second side of the circuit board and the flat parts are arranged on the first side of the circuit board. For example, it is possible that a first flat part is connected to a first contact pad over the entire surface. This first contact pad can be electrically contacted with a second contact pad via vias.

At least a first semiconductor switch can be connected to the second contact pad with its power terminal. The corresponding second power terminal of the at least one first semiconductor switch can be connected to a third contact pad, which is electrically insulated from the second and the first contact pad.

A fourth contact pad can be arranged on the side of the printed circuit board opposite the third contact pad, which is connected to the third contact pad via vias. A flat part can be attached to the fourth contact pad over its entire surface, preferably like the first flat part on the first contact pad. A good heat dissipation can be realised via this flat part.

Starting from the third contact pad, at least one further semiconductor switch can be arranged as a mirror image of the at least one first semiconductor switch, whereby the at least one further semiconductor switch is initially arranged with its power terminal on the third contact pad and is arranged with its corresponding power terminal on a fifth contact pad.

A sixth contact pad can be arranged opposite the fifth contact pad corresponding to the first contact pad. The fifth and sixth contact pads can be formed corresponding to the first and second contact pads, in particular identically thereto. A flat part can again be arranged on the sixth contact pad, which is arranged like the first flat part on the first contact pad. The flat parts arranged on the first and sixth contact pad can be formed as a terminal lug.

The flat parts may be formed of copper, a copper alloy, aluminium or an aluminium alloy. It is also possible for the flat parts to be formed bimetallically, whereby the areas in contact with the contact pads are formed from a copper alloy and the terminal lugs projecting from the surface of the printed circuit board can be formed from an aluminium alloy. A mirror-inverted arrangement of copper alloy and aluminium alloy is also possible.

A sandwich-like structure in such a way that the printed circuit board is arranged between the semiconductor switches and the flat parts, with the semiconductor switches being arranged on one side of the printed circuit board and the flat parts on the other side of the printed circuit board, is also preferred.

According to an embodiment, it is also possible that on the first side of the PCB corresponding to the second side of the PCB, a second semiconductor switch is directly connected to the first contact pad. This is particularly possible if the semiconductor switches have their power terminals on their wide surfaces. The semiconductor switches are usually cuboid-shaped. Two opposite, wide surfaces can each be provided with a power terminal (source/drain). These power terminals can be arranged over a large area, in particular over the entire surface of the wide surfaces of the semiconductor switches. The wide surfaces of the semiconductor switches can be arranged over their entire surface on the contact pads and, in particular, soldered to them.

The printed circuit board is preferably sandwiched between two semiconductor switches. The contact pads are connected to each other via a plurality of vias. A current thus flows directly via the vias between the semiconductor switches and a conductor track is not necessary.

In the two variants described above, it should be noted that a switching terminal (gate) can be controlled via at least one separate contact pin of the semiconductor switch in each case. The gate contact can be controlled via a conductor track arranged on the printed circuit board. Only one switching current flows via the gate terminal, so that this can be routed via conductor tracks. The first to sixth contact pads are insulated from the gate terminal and the respective conductor track leading to the contact pin of the switching terminal of the semiconductor switch.

For good thermal conduction, it is proposed that the first and/or second semiconductor switch is directly connected to a flat part on a side facing away from the contact pads. The second side of the semiconductor switch is in particular also a wide surface on which a power terminal of the semiconductor switch is arranged. It is possible that one or both of the opposing semiconductor switches are each connected to a wide surface on one of the contact pads, respectively, and to the other wide surface with a flat part, respectively.

As explained, the contact pads are directly connected to each other via vias without any conductive tracks in between. This means that, according to one embodiment, the semiconductor switches are connected to each other exclusively via the vias. The semiconductor switches are arranged with their contact pins or contact surfaces of the power terminals directly on the contact pads, which are directly connected to each other via the vias. Thus, a current flow between the semiconductor switches takes place directly via the vias.

According to an embodiment, it is proposed that on the first side of the printed circuit board a contact pad has an area which is at least equal to the area of all terminals of the at least one semiconductor switch contacted on the second side of the printed circuit board. The at least one semiconductor switch on the second side of the printed circuit board may be contacted with two contact pads, wherein a first contact pad is provided for the contact pins of the power terminal of the semiconductor switch and a second contact pad, which is smaller for this purpose, is provided for the contact pin of the switching terminal. The contact pads of power terminals and switching terminals of several semiconductor switches can be arranged next to each other, insulated from each other, on the second side of the printed circuit board. Correspondingly, a full-surface contact pad can be located over the entire surface on the first side of the PCB. The contact pads of the power terminals on the second side of the printed circuit board are connected to the contact pad on the first side of the printed circuit board via a plurality of vias.

According to an embodiment, it is proposed that the flat part is connected to the at least one contact pad over the entire surface. A flat part may be arranged on the first contact pad, the fourth contact pad and/or the sixth contact pad. In this case, the flat part lies over the entire surface on the respective contact pad and is in particular soldered over the entire surface to the respective contact pad, so that the flat part enables current flow on the one hand and good heat transport on the other hand.

According to an embodiment, it is proposed that at least three contact pads insulated from each other are arranged on the first side of the printed circuit board. These may be the first contact pad, the fourth contact pad and the sixth contact pad. Corresponding contact pads, in particular second, third and fifth contact pads, are provided on the second side of the printed circuit board. The contact pads on the two sides of the printed circuit board are connected to each other exclusively via vias. The power terminals of the semiconductor switches are arranged on the contact pads of the second side of the PCB. Each of the contact pads on the first side of the printed circuit board is fully equipped with a flat part.

According to an embodiment, it is proposed that at least one contact pad for each of two power terminals is arranged on the second side of the printed circuit board for each semiconductor switch. The semiconductor switches can be connected on the input side, for example on a first power terminal with contact pads separated from one another, and contact pads can be provided in parallel for the switching terminals. This makes it possible to lead switching terminals to contact pins that are directly adjacent to the contact pins of the power terminals of the semiconductor switch.

On the other side of the semiconductor switch, where only power terminals are routed to contact pins, all contact pins can rest on a full-surface contact pad. It is thus possible for a single contact pad, in particular the third contact pad, to connect a plurality of power terminals of semiconductor switches to one another. The contact pad is full-surface and uninterrupted.

In order to enable good current transport, in particular to ensure the current carrying capacity of the circuit, a plurality of vias per contact pad is provided. The number of vias per contact pad can exceed 10, in particular also 30. Thus, it is possible that 40-50 vias per contact pad are provided to allow a sufficiently high current flow.

According to an embodiment, it is proposed that at least one of the flat parts is led out of the surface of the printed circuit board and forms a connection lug for a power conductor. In a normal projection, i.e. in a top view of the printed circuit board, the flat part may be led out of the surface of the printed circuit board, thus enabling contacting with a terminal lug in a particularly simple manner.

According to an embodiment, it is proposed that the conductor layer between two edges of the printed circuit board is completely cut through and divides the printed circuit board into two areas, wherein a high-current circuit according to one of the preceding claims is arranged in a first area and a logic circuit is arranged in a second area. Thus, it is possible to accommodate both a power circuit and a logic circuit on a single printed circuit board. By separating the conductive layer, there is no electrically conductive connection between these two areas of the printed circuit board. As a result, heat transfer from the first area to the second area is severely impeded because the substrate of the PCB is a poor conductor of heat. On the one hand, this makes it possible to load the PCB in the area of the high-current circuit with currents that lead to temperatures that are unsuitable for logic devices. For example, the high-current circuit can heat up to over 80° C. without negatively affecting logic components on the other side, since a thermal decoupling of the two areas of the PCB is ensured by separating the conductor layer.

BRIEF DESCRIPTION OF THE DRAWINGS

In the following, the subject matter is explained in more detail with reference to a drawing showing embodiments. In the drawing show.

DETAILED DESCRIPTION OF SPECIFIC EMBODIMENTS

Figure 1:
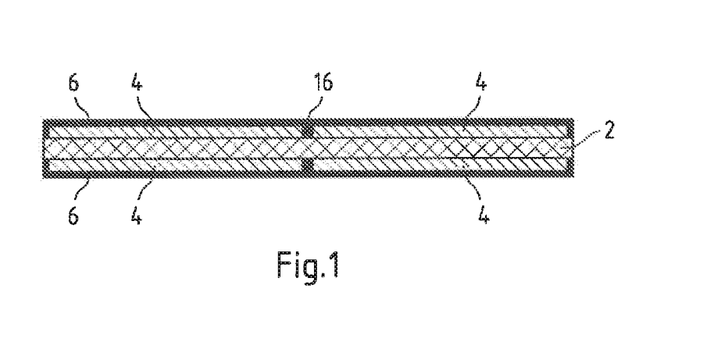
FIG. 1 a layered structure of a printed circuit board.

FIG. 1 shows a cross-section of a printed circuit board with a substrate 2. The substrate 2 may be a fibre-reinforced epoxy resin. In particular, the substrate 2 is non-conductive. The substrate 2 is a conventional substrate for printed circuit boards.

A conductive layer 4 is applied to the substrate 2. The conductor layer 4 is in particular a copper layer. The conductor layer 4 is usually thinner than 1 mm and is brought into the desired topology by exposure and etching during the production of printed circuits. The conductor layer 4 is covered with an insulation layer 6. The insulation layer 6 can be, for example, a solder resist. At places where the conductor layer 4 is to be contacted, the insulation layer 6 can be removed and/or the conductor layer 4 can be led out of the insulation layer 6 there. This allows, for example, a contact pad to be applied to the conductor layer 4. The structure of the printed circuit board according to FIG. 1 is a conventional structure as used in standard printed circuit boards.

Figure 2:
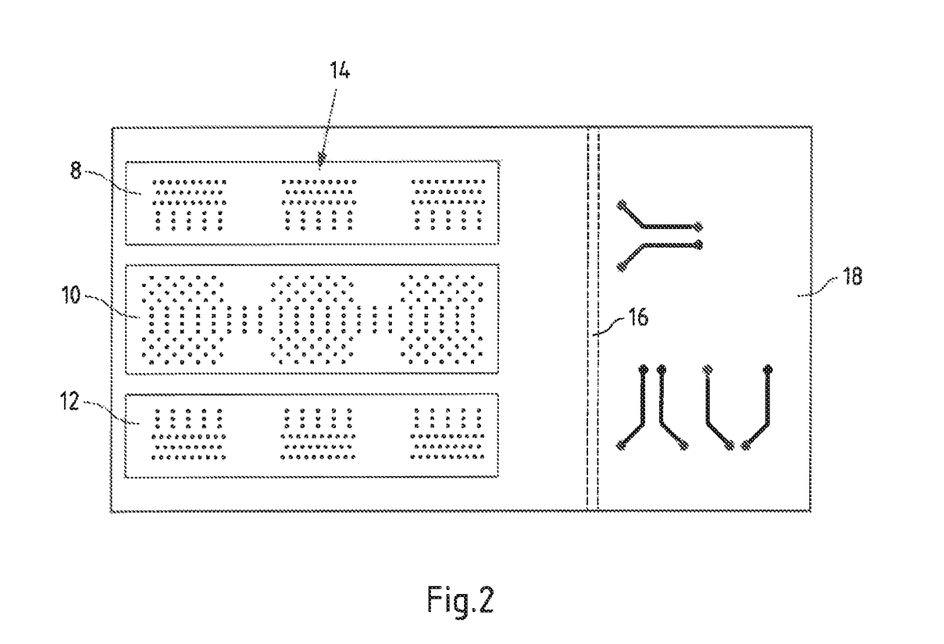
FIG. 2 a top view of a first side of the printed circuit board.

With the help of such a standard structure of a printed circuit board, it is possible to realise the circuit arrangement in question. For this purpose, as shown in FIG. 2, at least one large-area contact pad 8 is arranged on a first side of the printed circuit board. FIG. 2 shows a first contact pad 8, a third contact pad 10 and a fifth contact pad 12. The numbering of the contact pads 8, 10, 12 is merely intended to simplify reading, whereby the numbering is not to be understood as meaning that a second contact pad necessarily requires a first contact pad, a third contact pad necessarily requires first and second contact pads, a fourth contact pad requires third to first contact pads and so on.

The contact pads 8 to 12 are applied to the conductor layer 4 on the first side of the printed circuit board, in particular by metallic coating of the conductor layer 4 in an opening of the insulation layer 6. The contact pads 8-12 as well as all other contact pads mentioned herein are preferably identical in structure, being formed from the conductor layer 4 and a metallic coating applied thereto. The metallic coating can, for example, be a tin plating. The metallic coating preferably closes plane-parallel with the insulation layer 6, whereby deviations of a few μm are possible.

The contact pads 8, 10, 12 are interspersed with vias 14, whereby the vias 14 can be holes through the conductor layers 4 and the substrate 2. The vias 14 penetrate the substrate 2 completely and are at least partially metallic or metallically coated. The vias 14 are electrically conductive. As a result, the vias 14 create an electrical short-circuit between the conductor layers 4 facing each other and thus the contact pads applied to the conductor layers 4. By separating the conductor layer 4, it is achieved that the contact pads 8-12 as well as the contact pads mentioned below are each insulated from each other on one side of the printed circuit board, but are short-circuited to each other via the vias on opposite sides of the printed circuit board. The contact pads 8-12 as well as also the following contact pads have a large surface area and are suitable for applying a contact part with a large surface area.

In FIG. 2 it is further shown that the conductor layer 4 is completely separated at a separation point 16, so that the printed circuit board is divided into two areas. These two areas are, on the one hand, the area with the contact pads and, on the other hand, an area with a logic circuit 18. The logic circuit 18 is thermally decoupled from the high-voltage circuit, as implemented on the printed circuit board by the contact pads, by the separation point 16. The provision of the isolation point 16 and the logic circuit 18 is optional and mentioned here for the sake of completeness.

Figure 3:
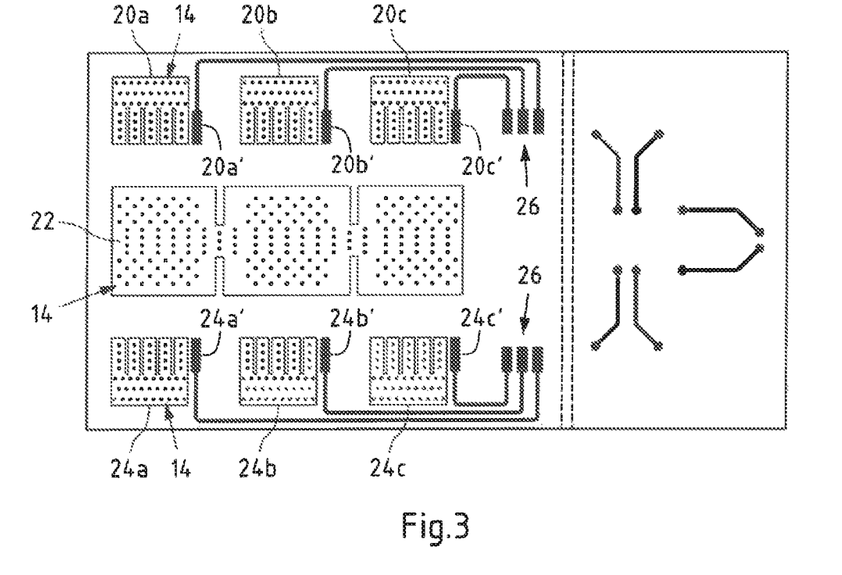
FIG. 3 a top view of a second side of the printed circuit board.

FIG. 3 shows a second side of a printed circuit board according to FIG. 1 whose structure corresponds to the structure of the printed circuit board according to FIG. 2. Second contact pads 20a-c, a fourth contact pad 22 and sixth contact pads 24a-c can be seen. The second contact pads 20a-c can be short-circuited to each other via the conductor layer 4. The contact pads 20a-c, 22 and 24a-c are insulated from each other by separating the conductor layer 4 accordingly. Vias 14, which pass through the respective contact pads 20, 22, 24, can be seen.

It can also be seen that the contact pads 20a-c and the contact pads 24a-c have tongue-like connection areas. This is optional, as full-surface connection areas can also be provided instead of the tongue-like connection areas. The corresponding connection areas serve to connect a first power terminal of a semiconductor switch, as will be shown below. Power terminals of semiconductor switches are attached, in particular soldered, to the contact pads 20a-c, 22, 24, as will be shown below.

For switching the semiconductor switches, a contact pad 20a', 20b', 20c', 24a', 24b', 24c' is provided in addition to each of the contact pads 20a-c, 24a-c. These additional contact pads 20a'-24c' serve to connect a switching terminal of a semiconductor switch. The contact pads 20a'-24c' are electrically insulated from all other contact pads and can be switched together or separately via switching terminals 26. This allows a group of semiconductor switches to be controlled together or each individual semiconductor switch to be controlled individually.

Figure 4A:
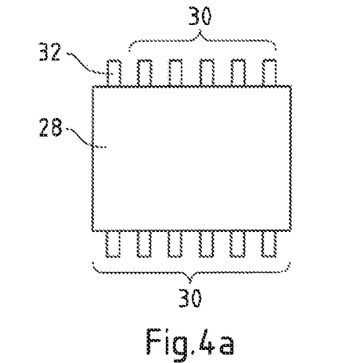
FIG. 4a, b views of a first semiconductor switch.
Figure 4B:
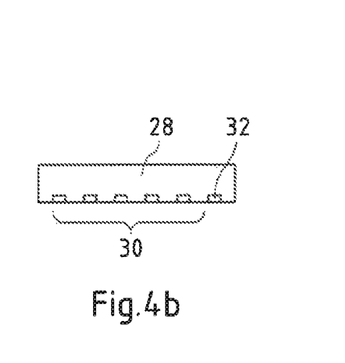

FIG. 4a, b show a semiconductor switch 28 in a top view and in a side view. The semiconductor switch 28 has contact pins 30 intended for a power terminal and at least one contact pin 32 for a switching terminal. In FIG. 4b it can be seen that the semiconductor switch 28 is of SMD construction, so that it can be placed directly with its contact pins 30, 32 on the contact pads 8-12, 20-24. The semiconductor switch 28 is, for example, a MOSFET or IGBT.

Figure 5A:
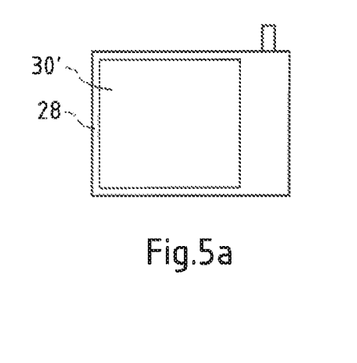
FIG. 5a, b views of a second semiconductor switch.
Figure 5B:
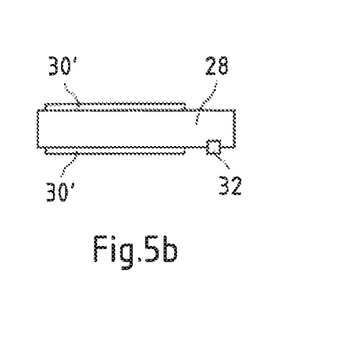

FIG. 5a, b shows another construction of a semiconductor switch 28, in which contact pads 30' are provided on opposite broad surfaces of the semiconductor switch 28 to form the power terminals. A contact pin 32 forms the switching terminal. These large-area contact surfaces 30' enable large-area contacting of the power terminals and thus a high power flow through the semiconductor switch 28.

Figure 6:
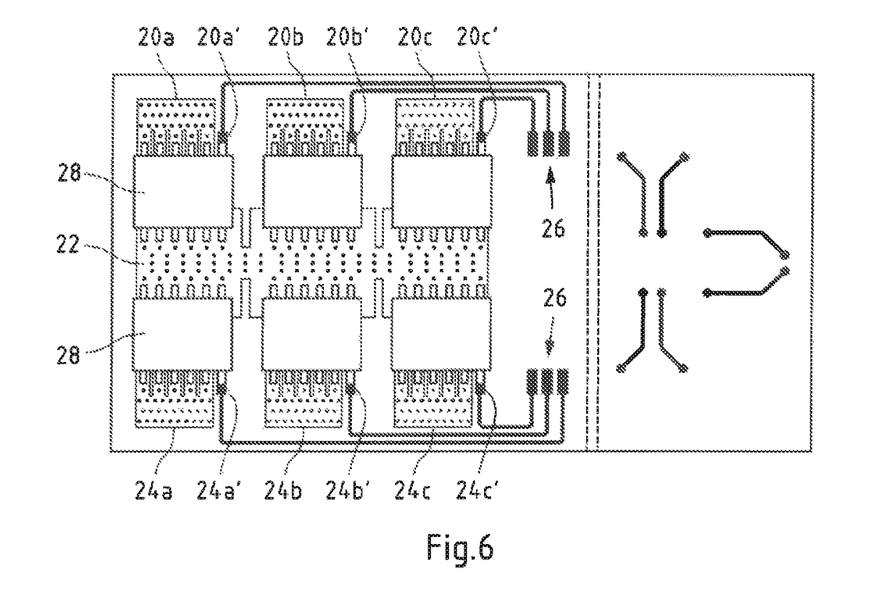
FIG. 6 an assembled second side of the printed circuit board with semiconductor switch.

A semiconductor switch 28 according to FIG. 4 is applied to the second side of the printed circuit board shown in FIG. 3, as shown in FIG. 6. It can be seen that the contact pins 30 are in contact with the contact pads 20a, b, c on the one hand and with the contact pad 22 on the other hand. The respective contact pins 32 are connected to the respective contact pads 20a'-c' and thus to the switching terminal 26. Furthermore, semiconductor switches 28 are connected with their contact pins 30 on the one hand to the contact pads 24a-c and on the other hand to the contact pad 22. The respective contact pins 32 are connected to the respective contact pads 24a'-c' and thus to the switching terminal 26. Thus, the power terminals of the semiconductor switches 28 are each connected via the contact pads 20a-c as well as 24a-c and the contact pad 22.

With the aid of the semiconductor switches 28, a connection can thus be established between the contact pads 20a-c and the contact pad 22 and between the contact pad 22 and the contact pads 24a-c depending on their switching state.

The semiconductor switches 28 can be soldered with their contact pins 30, 32.

Figure 7A:
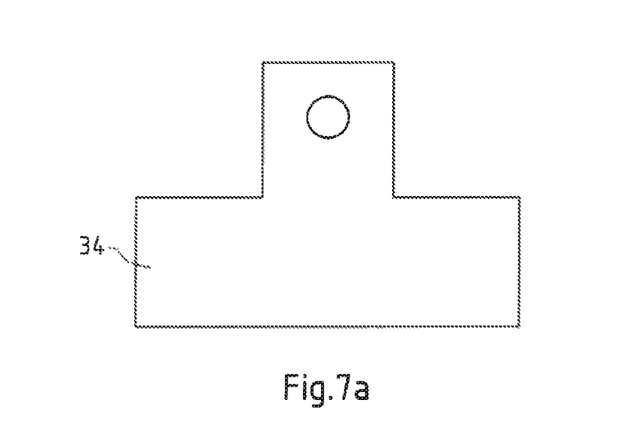
FIG. 7a, b views of flat parts.
Figure 7B:
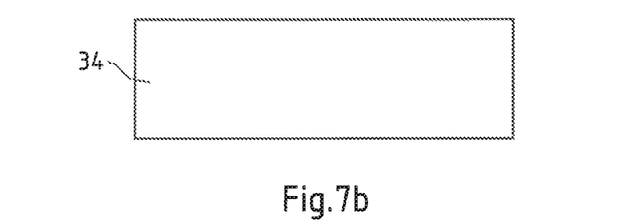
Figure 8:
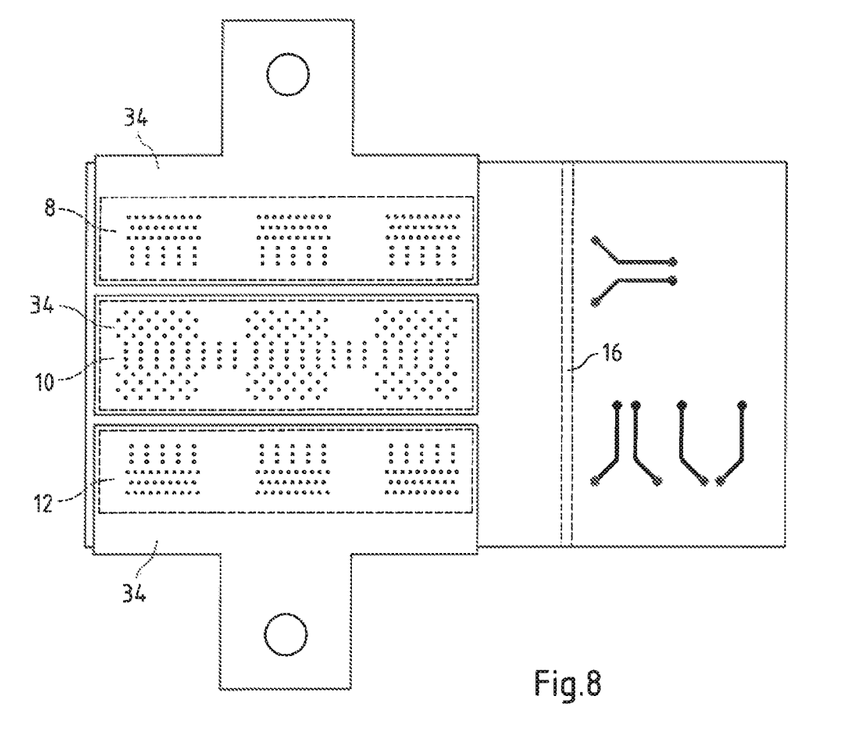
FIG. 8 a top view of a populated first side with flat parts.

Flat parts as shown in FIG. 7 are provided for connecting the circuit as shown in FIG. 6 to cables. On the one hand, a flat part 34 according to FIG. 7a and a flat part 34 according to FIG. 7b are provided. With the aid of the flat part 34 according to FIG. 7a, which is formed as a connection lug, an external connection to the circuit can be made possible. A flat part 34 according to FIG. 7b can be used as a heat sink.

The flat parts according to FIG. 7a, b are applied to the circuit according to FIG. 2, in particular soldered over the entire surface. A flat part 34, which is formed as a terminal lug according to FIG. 7a, is applied to the first contact pad 8 and the fifth contact pad 12. A flat part 34 is applied to the contact pad 12 as a heat sink. The flat parts 34 are applied, in particular soldered, over the entire surface of the contact pads 8-12.

Figure 9:
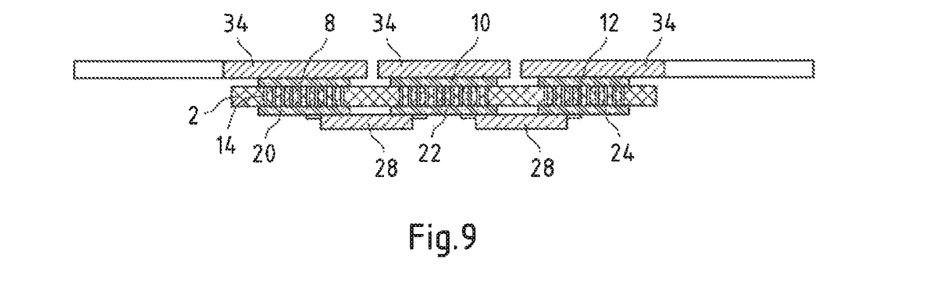
FIG. 9 a sectional view through a populated circuit assembly.

The structure of the circuit in the assembled state is shown in FIG. 9. FIG. 9 shows that the vias 14 pass through the substrate 2 and short-circuit the contact pads 8 and 20, 10 and 22 as well as 12 and 24 with each other. Current flows via the flat part 34 to the contact pad 8 and from there via the vias 14 to the contact pad 20. If the left-hand semiconductor switch 28 is closed, the current flows from the contact pad 20 via the semiconductor switch 28 to the contact pad 22. If the right-hand semiconductor switch 28 is closed, the current flows further from the contact pad 22 to the contact pad 24 and from there via the vias 14 to the contact pad 12 and finally onto the flat part 34.

The central flat part 34, which is applied to the contact pad 10, serves as a heat sink. Heat can be transported from the contact pad 22 to the contact pad 10 via the vias 14 and the flat part 34 can serve as an additional heat sink. This is particularly useful in the case of high currents, which are quite possible in automotive applications.

Figure 10:
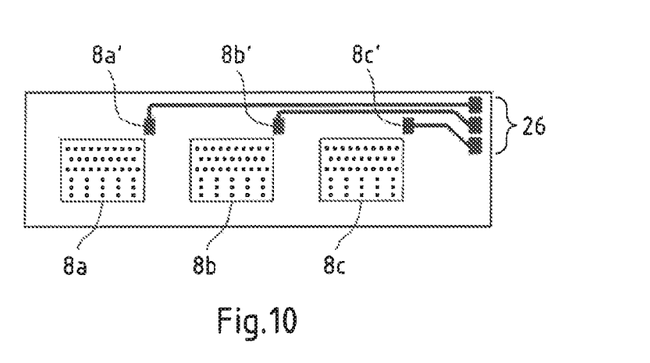
FIG. 10 a top view of a second side according to an embodiment example.

FIGS. 10-16 show another embodiment in which the PCB is sandwiched between two flat parts. FIG. 10 shows a first side of a printed circuit board with contact pads 8a-c for a power terminal of a respective semiconductor switch 28 and contact pads 8a'-c' for a switching terminal of a respective semiconductor switch 28. The contact pads 8a-c can be short-circuited to each other or insulated from each other, whereas the contact pads 8a'-c' are insulated from each other and from the contact pads 8a-c and are routed to a switching terminal 26.

Figure 11:
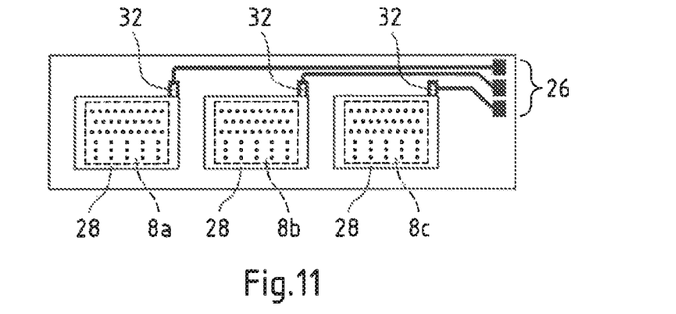
FIG. 11 the side according to FIG. 1 equipped with semiconductor switches.
Figure 12:
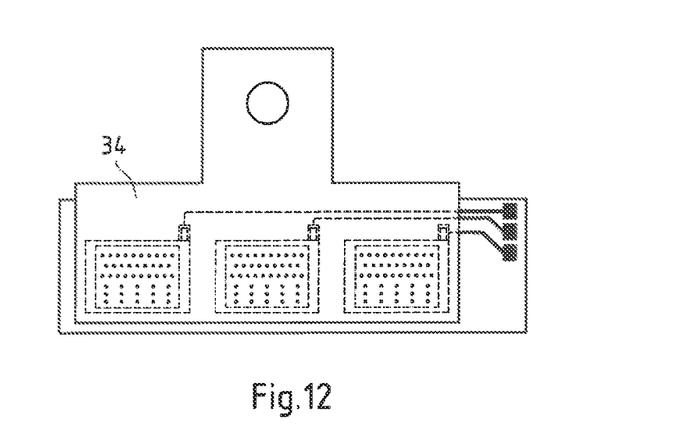
FIG. 12 the assembled semiconductor circuit according to FIG. 11 with a flat part.

In FIG. 11 it is shown that the semiconductor switches 28 with their terminals 30' are placed over the entire surface of the contact pads 8a-c and are connected to them. The semiconductor switches 28 are connected to the contact pads 8a'-c' via contact pins 32. The semiconductor switches 28 have a structure as shown in FIG. 5. A flat part 34 is then placed on these semiconductor switches 28, as can be seen in FIG. 12.

Figure 13:
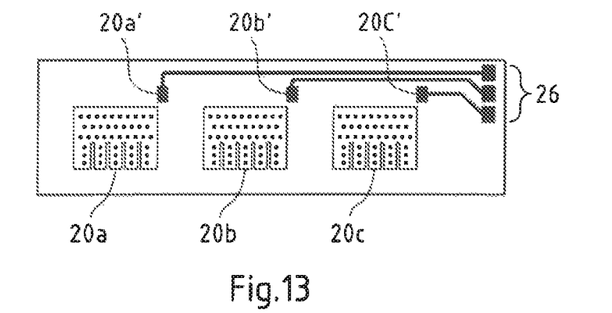
FIG. 13 a first side corresponding to FIG. 11.
Figure 14:
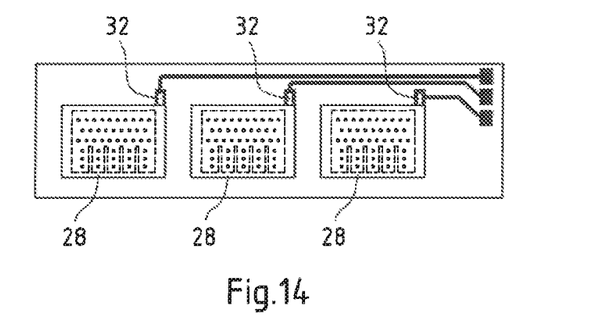
FIG. 14 a populated first side according to FIG. 13.
Figure 15:
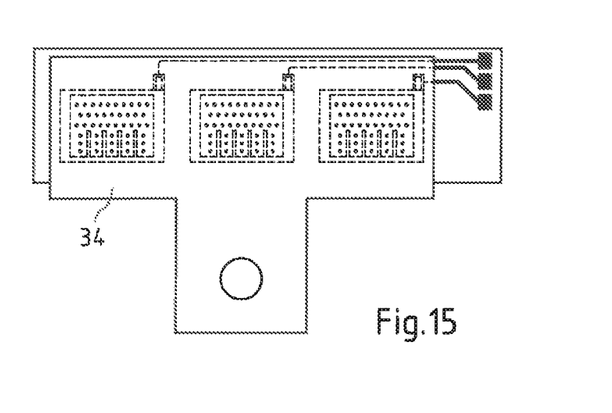
FIG. 15 an assembled circuit covered with a flat part as in FIG. 14.

On the other side of the substrate 2 is a corresponding structure with contact pads 20a-c and 20a'-c' as shown in FIG. 13. Again, semiconductor switches 28 are connected with their power terminals 30' to the contact pads 20a-c and with their switching terminals 32 to the contact pins 20a'-c', as shown in FIG. 14. Subsequently, a flat part 34 is also placed over the entire surface of the semiconductor switches 28, as shown in FIG. 15.

Figure 16:
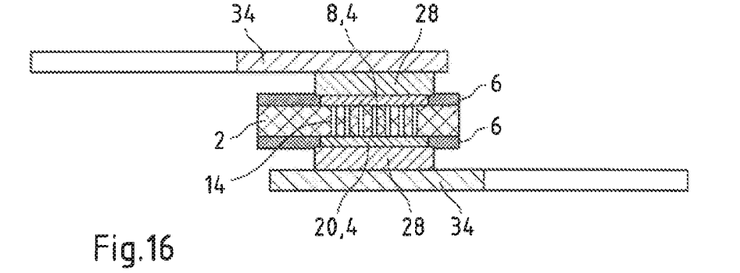

FIG. 16 shows a cross-section through such a sandwich-like structure. Between the flat parts 34 the semiconductor switches 28 with their terminals 30' are arranged in a sandwich-like manner on the contact pads 8, 20, which are applied to the two conductor layers 4. The contact pads 8-20 are short-circuited to each other via the vias 14. A current flow occurs via the flat part 4, the semiconductor switch 28, the contact pad 8, the vias 14, the contact pad 20 and the semiconductor switch 28 to the flat part 34. A direct short circuit between the semiconductor switches 28 is ensured by the vias 14. Since the flat part 34 rests directly on the semiconductor switches 28, it serves not only as an electrical supply line but also as a heat sink.

LIST OF REFERENCE SIGNS

2 Substrate
4 Conductor layer
6 insulation layer
8 first contact pads
10 third contact pads
12 fifth contact pads
14 via
16 Interface
18 logic circuit
20 second contact pads
22 fourth contact pads
24 Sixth contact pads
26 Switching terminals
28 Semiconductor switches
30, 32 Contact pins
34 flat part

What is claimed is:

1. A high-current circuit, in particular motor vehicle high-current circuit, comprising:
    a printed circuit board made from a non-conductive substrate, a conductor layer applied to the substrate and an insulating layer applied to the conductor layer, wherein contact pads which break through the insulation layer are arranged on both sides of the printed circuit board, and the contact pads are in contact with one another via vias through the substrate, the vias being arranged in the area of the contact pads,
    wherein a first one of the contact pads is arranged on a first side of the printed circuit board and multiple second ones of the contact pads are arranged on a second side of the printed circuit board, isolated from each other and neighbouring each other;
    multiple semiconductor switches, wherein each of the multiple semiconductor switches is directly connected to a respective one of the second contact pads and to the first contact pad directly via the vias and the respective one of the second contact pad, without further conductor tracks;
    wherein power terminals of the plurality of the semiconductor switches are respectively connected to a respective one of the second contact pads; and
    wherein the first contact pad is connected with two or more of the multiple second ones of the contact pads via a plurality of vias and arranged with their entire surface on the first side of the printed circuit board.

2. High-current circuit according to claim 1, wherein the areas of the first and second contact pads are arranged one above the other on the two sides of the printed circuit board.

3. High-current circuit according to claim 1, further comprising a flat part, on the first side of the printed circuit board, directly connected to the first contact pad.

4. High-current circuit according to claim 1, wherein two of the semiconductor switches are electrically connected in series with one another on the second side of the printed circuit board, a third contact pad on the second side forming an electrical connection between the semiconductors electrically connected in series with one another without a further conductor track.

5. High-current circuit according to claim 4, wherein the areas of the third and a fourth contact pad on the two sides of the printed circuit board are arranged one above the other.

6. High-current circuit according to claim 1, wherein a second semiconductor switch is directly connected to the first contact pad on the first side of the printed circuit board.

7. High-current circuit according to claim 6, wherein the first and/or second semiconductor switch is directly connected to a flat part on its side facing away from one of the contact pads, in particular in that the first semiconductor switch is connected to the second contact pad by means of a first wide surface and is connected to a first flat part by means of a second wide surface opposite the first surface, and/or the second semiconductor switch is connected to the first contact pad by means of a first wide surface and is connected to a second flat part by means of a second wide surface opposite the first surface.

8. High-current circuit according to claim 7, wherein the flat part is arranged directly on the second surface of the semiconductor switch.

9. High-current circuit according to claim 7, wherein the flat part is connected to the at least one contact pad over the entire surface.

10. High-current circuit according to claim 7, wherein at least one of the flat parts is led out of the surface of the printed circuit board and forms a terminal lug for a power conductor.

11. High-current circuit according to claim 1, wherein the semiconductor switches have power terminals on their wide surfaces.

12. High-current circuit according to claim 1, wherein the semiconductor switches are electrically connected to one another exclusively via the vias.

13. High-current circuit according to claim 1, wherein the contact pad on the first side of the printed circuit board has an area which is at least equal to the area of all the terminals of the semiconductor switches on the second side of the printed circuit board.

14. High-current circuit according to claim 1, wherein on the second side of the printed circuit board a power terminal of a respective one of the semiconductor switches is directly connected to the respective second contact pad and a switching terminal of the semiconductor switch is connected to a further contact pad of a conductor track.

15. High-current circuit according to claim 1, wherein at least three contact pads which are insulated from one another are arranged on the first side of the printed circuit board, the at least three contact pads each being connected via the vias to power terminals of a plurality of the semiconductor switches, and a flat part being connected to each of the contact pads over the entire surface.

16. High-current circuit according to claim 1, wherein at least one second contact pad for each respective one of two power terminals is arranged on the second side for each respective one semiconductor switch.

17. High-current circuit according to claim 1, wherein contact pads of a plurality of power terminals of a plurality of the semiconductor switches are connected to one another over their entire surface on the second side.

18. High-current circuit according to claim 1, wherein the number of vias per contact pad of a power terminal is at least ten, preferably more than thirty.

19. High-current circuit according to claim 1 wherein the conductor layer between two edges of the printed circuit board is completely cut through and divides the printed circuit board into a first region and a second region, wherein the high-current circuit is arranged in the first region and a logic circuit is arranged in the second region.

* * * * *